United States Patent
Sampsell

Patent Number: 5,818,095
Date of Patent: Oct. 6, 1998

[54] HIGH-YIELD SPATIAL LIGHT MODULATOR WITH LIGHT BLOCKING LAYER

[75] Inventor: Jeffrey B. Sampsell, Plano, Tex.

[73] Assignee: Texas Instruments Incorporated, Dallas, Tex.

[21] Appl. No.: 928,251

[22] Filed: Aug. 11, 1992

[51] Int. Cl.⁶ .................................................. H01L 3/0232
[52] U.S. Cl. .......................................... 257/435; 257/659
[58] Field of Search ...................... 257/435, 758, 257/659

[56] References Cited

U.S. PATENT DOCUMENTS

| | | | |
|---|---|---|---|
| 4,448,491 | 5/1984 | Okubo | 350/344 |
| 4,710,732 | 12/1987 | Hornbeck | 332/7.51 |
| 5,050,123 | 9/1991 | Castro | 257/659 |
| 5,061,049 | 10/1991 | Hornbeck | 359/224 |
| 5,345,105 | 9/1994 | Sun et al. | 257/659 |

FOREIGN PATENT DOCUMENTS

| | | |
|---|---|---|
| A-0 084 930 | 1/1983 | European Pat. Off. . |
| A-0 341 003 | 4/1989 | European Pat. Off. . |
| A-0 464 897 | 6/1991 | European Pat. Off. . |
| A-58-222 546 | 12/1983 | Japan . |
| A-59-005 228 | 1/1984 | Japan . |
| 61-144051 | 7/1986 | Japan ...................................... 257/659 |
| A-2 097 581 | 2/1982 | United Kingdom . |

OTHER PUBLICATIONS

Larry J. Hornbeck, "Deformable–Mirror Spatial Light Modulators," *SPIE Critical Reviews Series*, vol. 1150, Aug. 1989, pp. 86–102.

*Primary Examiner*—Mark V. Prenty
*Attorney, Agent, or Firm*—Julie L. Reed; James C. Kesterson; Richard L. Donaldson

[57] ABSTRACT

A semiconductor device with an optically active region which receives light, and has a layer of metal which blocks the light from the substrate. The substrate contains addressing circuitry which can experience current leakage if photocarriers are allowed to form by contact with light. A layer of metal is deposited as an integral part of the device to prevent the light from reaching the substrate.

10 Claims, 2 Drawing Sheets

HIGH-YIELD SPATIAL LIGHT MODULATOR WITH LIGHT BLOCKING LAYER

BACKGROUND OF THE INVENTION

1. Field of the invention

This invention relates to spatial light modulators, more particularly to semiconductor spatial light modulators.

2. Background of the invention

Spatial light modulators typically consist of linear or area arrays of cells that are individually addressable. Examples of these are liquid crystal display cells, electro-optic modulators, magneto-optic modulators, and digital micromirrors (also known as deformable mirror devices). Spatial light modulators typically have some type of addressing circuitry that allow each cell to be individually addressed. Liquid crystal displays for example, have electrodes that allow the crystal material to either transmit or prevent transmission, when these devices operate in the transmissive mode. These electrodes may also have some type of memory structure associated with them that allows the electrode to hold the data that determines the state of each cell.

A problem exists for spatial light modulators that rely on semiconductor material in which to build their addressing circuitry. A light source must be used that impinges directly upon the cells. Light incident upon semiconductors, such as silicon, generates photocarriers. This can lead to the addressing and memory circuitry, if used, having leakage currents caused by these photocarriers.

Photocarrier generation can be reduced through the use of double-level metal addressing lines for dynamic random-access-memory (DRAM). This process, which typically involves using one level of metal for horizontal interconnects, and another level of metal for vertical interconnects such as data lines, address lines and power supplies, does cover a large portion of the substrate. Unfortunately, the amount of light used with spatial light modulators can overcome this coverage, and leakage-causing photocarriers are still a problem for semiconductor light modulators.

SUMMARY OF THE INVENTION

The present invention disclosed herein comprises a process and structure for a semiconductor spatial light modulator that dramatically reduces the generation of photocarriers in the semiconductor material. A layer of light-blocking metal is patterned to fit into the spatial light modulator's structure. The layer blocks significant portions of the illumination incident upon the modulator and prevents the light's contact with the semiconductor material. Additionally, it minimizes the risk of shorts between layers of addressing circuitry by reducing the sensitivity to pinhole defects.

BRIEF DESCRIPTION OF THE DRAWINGS

For a more complete understanding of the present invention and for further advantages thereof, reference is now made to the following Detailed Description taken in conjunction with the accompanying Drawings in which:

FIGS. 3A–3F show top views of an spatial light modulator array with a light blocking layer, layer-by-layer.

DETAILED DESCRIPTION OF THE PREFERRED EMBODIMENTS

Previously, the double level metal process of CMOS dynamic random-access memory (DRAM) was used to overcome the problems of light-generated carriers in semiconductor substrates. For the most part, this approach works, when light striking the device is at a low level. For systems requiring the spatial light modulators to utilize medium to high intensity light focused upon them, excessive photocarrier generation in the substrate still occurs.

Figure 1A:
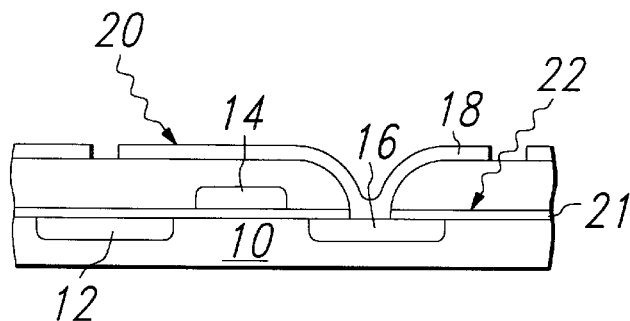
FIGS. 1A–1B illustrate a previous embodiment of addressing circuitry for a spatial light modulator and an embodiment of a light blocking layer.

An example of addressing circuitry with the double level metal is shown in FIG. 1A. A substrate 10 holds a source 16, a drain 12 and a gate 14. The addressing circuitry shown is for a digital micromirror, and consists of a layer of electrodes 18, which contact the source 16, of each addressing transistor in the substrate 10. Photon 20 impacts the electrode layer 18 and is blocked by the metal. Photon 22 is not blocked by the electrode layer and makes contact with the substrate through oxide layer 21. Photon 22 causes photocarriers in the substrate and leaks current away from the transistor, and eventually causes the electrode to lose its address data.

Figure 1B:
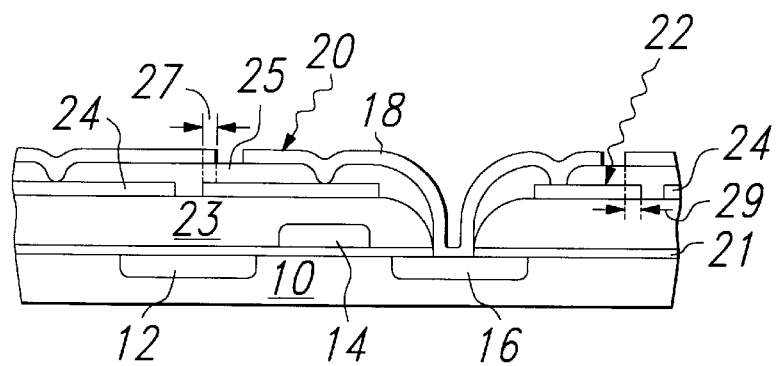

FIG. 1B shows an adaptation for a digital micromirror device, using an embodiment of the present invention. The substrate 10 has source 16, drain 12 and gate 14. A new layer of patterned metal, or other conducting opaque material forms a blocking layer 24. Blocking layer 24 can be supported by a layer of oxide 23, which is patterned to allow the addressing layer to make contact with the transistor source 16. The electrode layer 18 now lies above the blocking layer, on oxide layer 25. When photon 20 impinges upon the electrode, it is still blocked. Additionally, when photon 22 impinges upon the device, it passes through the electrode layer and impinges upon the light blocking layer 24 and is blocked.

This block feature also eliminates a majority of the pinhole risk. In FIG. 1B, one can see that over most of the area of the device, the existence of a pinhole defect in oxide layer 25 would allow electrode layer 18 to short to blocking layer 24. The risk associated with such a defect has been minimized by patterning contacts through oxide layer 25 so that a large percentage of the area of each of the geometries of layer 18 is at the same potential as the portion of layer 24 which lies beneath it. Pinhole risk is confined to the small overlap areas, such as 27 and 29, which are the only areas where overlapping portions of layer 18 and 24 are at different electrical potentials.

Figure 2:
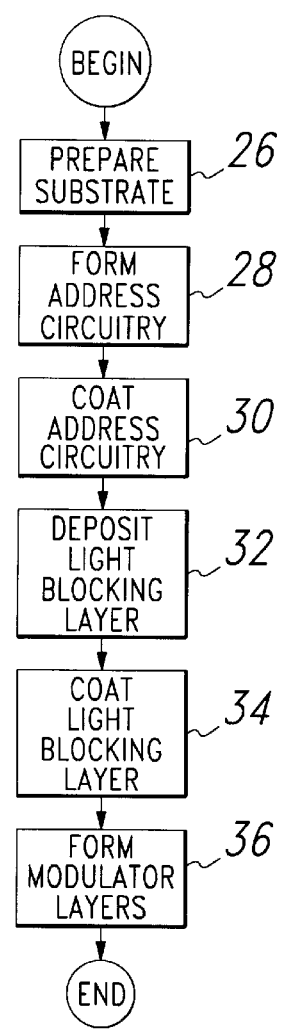
FIG. 2 shows the process flow chart for manufacture of a spatial light modulator with a light-blocking diagram.

FIG. 2 details a flow chart of one embodiment of the manufacturing process. The substrate, a semiconductor, is prepared, typically by being made into wafers in step 26. The addressing circuitry which will eventually activate the mirrors is formed in step 28. This addressing circuitry normally comprises electrically active layers on the substrate, whether these are implanted transistors or built up as thin films is up to the designer. Also as part of this step the metal layer, if not previously used to form the electrically active areas, is deposited onto the substrate to form the contacts to the electrically active areas. Step 30 allows the addressing circuitry to be coated with oxide to allow the light blocking layer to be deposited.

The light blocking layer is deposited in step 32, and patterned to avoid contact with the electrically active areas. It is undesirable that the light blocking layer come in contact with these areas, as the light blocking layer will be at a different potential, as will the mirror elements and the landing electrodes. The addressing electrodes are desired to be at varied potentials. Finally, in step 36, the standard modulator manufacturing process resumes. In the case of the digital micromirror, this process finishes by the deposition of the electrode layer and beam metal, coating these with a thick layer of photoresist to form a spacer layer, depositing the post and hinge layer, the mirror metal, and then patterning and etching to allow the mirrors to move freely through the space most recently occupied by the thick layer.

In FIG. 3, a top view of a digital micromirror device layer-by-layer is shown. FIG. 3A shows the first layer of the device, a substrate region 38 which roughly corresponds to the area of the substrate over which a modulator would be manufactured. Regions 40 represent the electrically active regions that will signal the electrodes to make the modulator cell respond, such as the drain 16 from FIGS. 1A and 1B. In FIG. 3B, the layer of FIG. 3A was coated with oxide, and patterned to form the contacts 42 to the electrically active regions of FIG. 3A. FIG. 3C illustrates the light blocking layer, 44, which is one layer above the contacts formed in FIG. 3B. The long dashed lines will be used to represent this layer, as the dots were used in FIG. 3A to represent the electrically active regions, and the solid lines are used to indicate contacts. Notice that there is a gap between the metal pieces 44 covering the contacts to the electrically active regions, and the rest of the metal 46. This results from the different intended voltages for these areas. The inner metal layers will be at the addressing potentials, the outer at the addressed element potential.

Figure 3A:
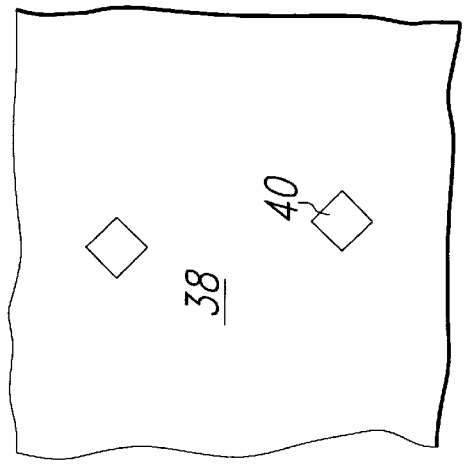
Figure 3A:
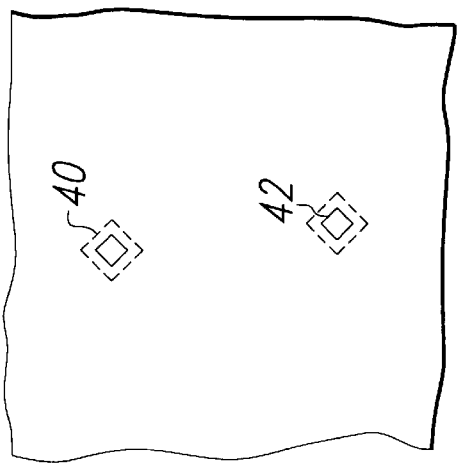
Figure 3C:
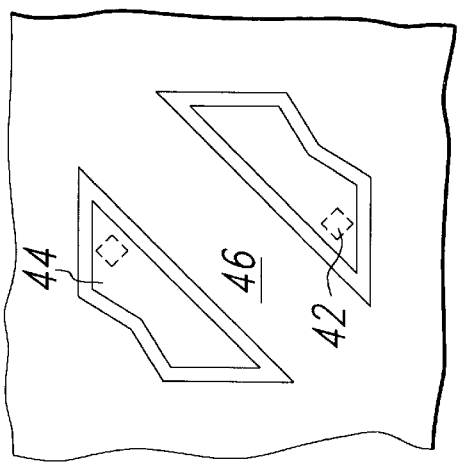
Figure 3D:
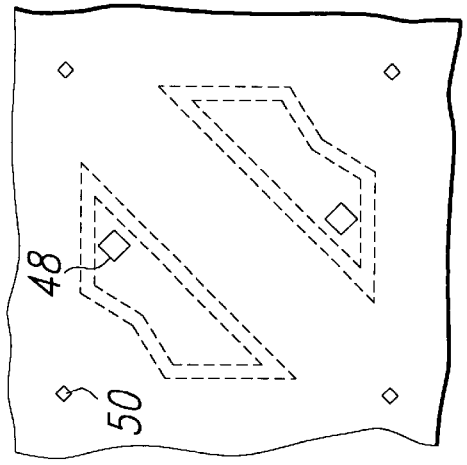
Figure 3E:
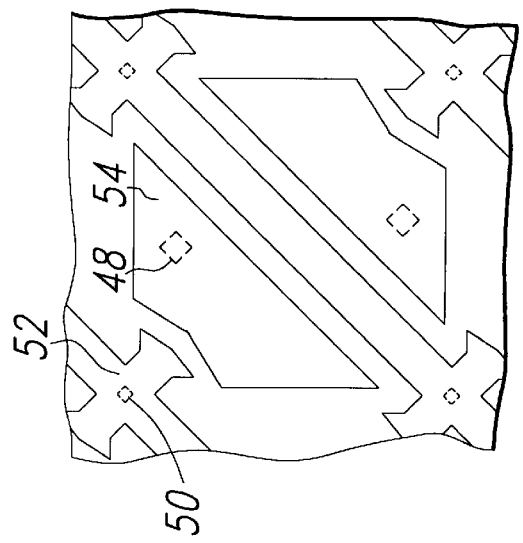

FIG. 3D shows yet another contact layer. These contacts 48 touch the inner metal pieces 44 from FIG. 3C. Additionally, contacts 50, which touch the metal layer 46 from FIG. 3C, will keep the metal of the active area of the modulator at ground. These contacts 50 are each connected to up to four different mirrors in the array, only one of which is shown here, and thus are shown merely as small lines. In FIG. 3E the modulator active region is deposited. The post metal and landing electrodes 52 touch the contacts 50 from FIG. 3D, grounding them, and the addressing electrodes 54 contact the inner contacts 48 from FIG. 3D. The short dashed line designates the electrode layer shown in FIG. 3E.

Figure 3F:
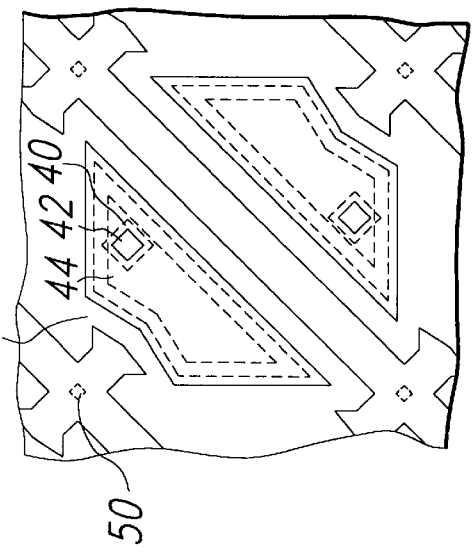

Finally, in FIG. 3F, the entire addressing circuitry is shown with FIGS. 3A–3E stacked upon one another. The dotted regions 40 are the implants from FIG. 3A. The solid squares actually represent two layers of contacts, the layers from FIG. 3B and FIG. 3D, since those contacts lie on the same grid on the substrate. Finally, the contacts 50 of FIG. 3D at the posts and the final layer of electrode metal, forming the addressing electrodes 54 are added to complete the cells addressing circuitry. From this point the standard manufacturing of the modulator in question resumes. If the modulator is not a digital micromirror, the contacts for the posts would more than likely differ, as would the elimination of the beam metal in FIGS. 3E and 3F.

Thus, although there has been described to this point particular embodiments of a semiconductor light modulator with a light blocking layer it is not intended that such specific references be considered as limitations upon the scope of this invention except in-so-far as set forth in the following claims.

What is claimed is:

1. A semiconductor device comprising:
    a. a substrate;
    b. electrically active regions in said substrate;
    c. a first metal layer blocking substantially all light from reaching said substrate, comprising at least two regions, one region contacting at least one of said electrically active regions in said substrate, another region avoiding contact with said electrically active regions; and
    d. a second metal layer overlaying said first metal layer and forming landing electrodes and addressing electrodes, wherein said addressing electrodes are in connection with said one region contacting said electrically active regions, and said landing electrodes are in connection with said another region avoiding contact with said electrically active regions.

2. The device of claim 1 wherein said substrate is silicon.

3. The device of claim 1 wherein said electrically active regions further comprise sources and drains of transistors.

4. The device of claim 1 wherein said device is a digital micromirror device.

5. The semiconductor device of claim 1 wherein said second metal layer blocks substantially all light from reaching the gap between said one region and said another region of said first metal layer.

6. A semiconductor spatial light modulator for modulating a beam of light, said device comprising:
    a substrate;
    an electrode layer overlying said substrate, said electrode layer divided into two regions, one region forming address electrodes, the other region forming landing electrodes, said landing and address electrodes separated by a gap in said electrode layer; and
    a blocking layer underlying said electrode layer such that portions of said beam of light passing through said gap are blocked from reaching said substrate, wherein said blocking layer is comprised of at least two blocking regions, a first blocking region in electrical contact with said address electrodes and a second blocking region in electrical contact with said landing electrodes.

7. The device of claim 6 wherein said device is a digital micromirror device.

8. The device of claim 6 further comprising an oxide layer between said electrode layer and said blocking layer.

9. The device of claim 6 further comprising an oxide layer between said blocking layer and said substrate.

10. The device of claim 6 further comprising at least one electrically active region on said substrate, wherein at least a portion of said blocking layer is in electrical contact with said electrically active region.

* * * * *